United States Patent
Frigo et al.

(10) Patent No.: US 10,148,292 B2
(45) Date of Patent: Dec. 4, 2018

(54) ERROR-CORRECTING CODE

(71) Applicant: QUANTA COMPUTER, INC., Tao Yuan Shien (TW)

(72) Inventors: Matteo Frigo, Acton, MA (US); Lawrence Colm Stewart, Wayland, MA (US)

(73) Assignee: QUANTA COMPUTER, INC. (TW)

( * ) Notice: Subject to any disclaimer, the term of this patent is extended or adjusted under 35 U.S.C. 154(b) by 0 days.

(21) Appl. No.: 15/472,285

(22) Filed: Mar. 29, 2017

(65) Prior Publication Data

US 2017/0201346 A1 Jul. 13, 2017

Related U.S. Application Data

(62) Division of application No. 14/206,435, filed on Mar. 12, 2014, now Pat. No. 9,673,841.

(Continued)

(51) Int. Cl.
*H03M 13/00* (2006.01)
*H03M 13/39* (2006.01)
(Continued)

(52) U.S. Cl.
CPC ..... *H03M 13/3972* (2013.01); *H03M 13/616* (2013.01); *H04L 1/0041* (2013.01);
(Continued)

(58) Field of Classification Search
CPC ... H04L 1/0041; H04L 1/0045; H04L 1/0057; H03M 7/3086; H03M 13/616; H03M 13/3972; H03M 13/11
(Continued)

(56) References Cited

U.S. PATENT DOCUMENTS

| 5,012,193 A | 4/1991 | Chen |
| 5,323,402 A | 6/1994 | Vaccaro et al. |

(Continued)

FOREIGN PATENT DOCUMENTS

| CN | 101288256 A | 10/2008 |
| CN | 101621353 A | 1/2010 |
| TW | 200637168 B | 10/2006 |

OTHER PUBLICATIONS

Philip A. Chou et al., "Practical Network Coding", Allerton Conference on Communication, Control, and Computing, Inproceedings, Oct. 1, 2003.

(Continued)

*Primary Examiner* — Albert Decady
*Assistant Examiner* — Osman M Alshack
(74) *Attorney, Agent, or Firm* — SU IP Consulting

(57) ABSTRACT

An example method to decode an error-correcting code includes receiving a tuple including a seed and a coded packet over a communication channel, and based on the seed, reconstructing a set of pseudorandom coefficients used by an encoder to create the coded packet. The method also includes entering the set of pseudorandom coefficients and the coded packet in a decoding matrix and reducing the decoding matrix to a row echelon form. After reducing the decoding matrix to a row echelon form, the method further includes determining if the decoding matrix is decodable up to a number of rows, reducing the decoding matrix up to the number of rows by backward substitution so a part of the first matrix becomes an identity matrix and a corresponding part of the second matrix comprise source packets, and extracting the source packets from the padded packets.

6 Claims, 11 Drawing Sheets

Related U.S. Application Data

(60) Provisional application No. 61/786,594, filed on Mar. 15, 2013.

(51) Int. Cl.
  *H04L 1/00* (2006.01)
  *H03M 7/30* (2006.01)
  *H03M 13/11* (2006.01)

(52) U.S. Cl.
  CPC .......... *H04L 1/0045* (2013.01); *H04L 1/0057* (2013.01); *H03M 7/3086* (2013.01); *H03M 13/11* (2013.01)

(58) Field of Classification Search
  USPC ........................................ 714/752, 728, 776
  See application file for complete search history.

(56) References Cited

U.S. PATENT DOCUMENTS

| | | | |
|---|---|---|---|
| 5,870,412 A | 2/1999 | Schuster et al. | |
| 6,023,783 A | 2/2000 | Divsalar et al. | |
| 6,490,243 B1* | 12/2002 | Tanaka | H03M 13/00 370/216 |
| 8,045,457 B1 | 10/2011 | Satish et al. | |
| 8,516,332 B1* | 8/2013 | Burd | G11B 20/1833 714/752 |
| 9,178,535 B2 | 11/2015 | Luby et al. | |
| 2002/0034261 A1 | 3/2002 | Eidson et al. | |
| 2004/0028120 A1 | 2/2004 | Bott et al. | |
| 2004/0034828 A1 | 2/2004 | Hocevar | |
| 2005/0226321 A1 | 10/2005 | Chen | |
| 2008/0049746 A1 | 2/2008 | Morrill et al. | |
| 2008/0143598 A1 | 6/2008 | Heckler et al. | |
| 2008/0273631 A1 | 11/2008 | Gho et al. | |
| 2010/0008288 A1* | 1/2010 | Taori | H04B 7/15521 370/315 |
| 2010/0095189 A1 | 4/2010 | Park et al. | |
| 2010/0112957 A1* | 5/2010 | Kong | H04L 1/06 455/67.11 |
| 2010/0281331 A1* | 11/2010 | Hammons, Jr. | H04L 1/1812 714/752 |
| 2011/0004811 A1* | 1/2011 | Mourad | H03M 13/1171 714/781 |
| 2011/0258514 A1 | 10/2011 | Lasser | |
| 2013/0039410 A1* | 2/2013 | Tan | H03M 13/05 375/240.02 |
| 2013/0195106 A1* | 8/2013 | Calmon | H04B 7/15521 370/389 |
| 2013/0238962 A1* | 9/2013 | Summerson | H03M 13/23 714/795 |
| 2014/0281837 A1 | 9/2014 | Frigo et al. | |
| 2015/0085648 A1* | 3/2015 | Leith | H04L 47/12 370/230 |

OTHER PUBLICATIONS

Jay Kumar Sundararajan et al., "Network Coding Meets TCP", IEEE INFOCOM 2009 proceedings, 2009, pp. 280-288.

* cited by examiner

| Step | Description | Data |
|---|---|---|
| 308 | form augmented packet | 1 3 1 5 5 |
| 310 | increment R | R = 2 |
| 312-316 | Adjust window | L = 1 |
| 316 | form padded packets in [L..R) window | 1 3 1 5 5 |
| 322-338 | generate coded packets | |
| 324 or 328 | generate seed | first = 1, seed = 0 |
| 326 or 330 | generate coefficients | 1 |
| 332 | set first to 0 | first = 0 |
| 334 | produce a linear combination of packets | 1 3 1 5 5 |
| 336 | Transmit (L, R, r, data) | 1 2 0 1 3 1 5 5 |
| 338 | set M := M + rate | M = 1.500000 |
| 324 or 328 | generate seed | first = 0, seed = 477 |
| 326 or 330 | generate coefficients | 10 |
| 332 | set first to 0 | first = 0 |
| 334 | produce a linear combination of packets | 10 13 10 4 4 |
| 336 | Transmit (L, R, r, data) | 1 2 477 10 13 10 4 4 |
| 338 | set M := M + rate | M = 2.000000 |
| 324 or 328 | generate seed | first = 0, seed = 448 |
| 326 or 330 | generate coefficients | 2 |
| 332 | set first to 0 | first = 0 |
| 334 | produce a linear combination of packets | 2 6 2 10 10 |
| 336 | Transmit (L, R, r, data) | 1 2 448 2 6 2 10 10 |
| 338 | set M := M + rate | M = 2.500000 |

FIG. 5

| Step | Description | Data |
|---|---|---|
| 308 | form augmented packet | 2 4 7 1 6 14 |
| 310 | increment R | R = 3 |
| 312-316 | Adjust window | L = 1 |
| 316 | form padded packets in [L..R) window | 1 3 1 5 5 0<br>2 4 7 1 6 14 |
| 322-338 | generate coded packets | |
| 324 or 328 | generate seed | first = 1, seed = 0 |
| 326 or 330 | generate coefficients | 0 1 |
| 332 | set first to 0 | first = 0 |
| 334 | produce a linear combination of packets | 2 4 7 1 6 14 |
| 336 | Transmit (L, R, r, data) | 1 3 0 2 4 7 1 6 14 |
| 338 | set M := M + rate | M = 3.000000 |
| 324 or 328 | generate seed | first = 0, seed = 244 |
| 326 or 330 | generate coefficients | 13 7 |
| 332 | set first to 0 | first = 0 |
| 334 | produce a linear combination of packets | 3 11 11 11 13 12 |
| 336 | Transmit (L, R, r, data) | 1 3 244 3 11 11 11 13 12 |
| 338 | set M := M + rate | M = 3.500000 |

FIG. 6

| Step | Description | Data |
|---|---|---|
| 308 | form augmented packet | 3 3 6 4 7 |
| 310 | increment R | R = 4 |
| 312-316 | Adjust window | L = 1 |
| 316 | form padded packets in [L..R) window | 1 3 1 5 5 0<br>2 4 7 1 6 14<br>3 3 6 4 7 0 |
| 322-338 | generate coded packets | |
| 324 or 328 | generate seed | first = 1, seed = 0 |
| 326 or 330 | generate coefficients | 0 0 1 |
| 332 | set first to 0 | first = 0 |
| 334 | produce a linear combination of packets | 3 3 6 4 7 0 |
| 336 | Transmit (L, R, r, data) | 1 4 0 3 3 6 4 7 0 |
| 338 | set M := M + rate | M = 4.000000 |
| 324 or 328 | generate seed | first = 0, seed = 503 |
| 326 or 330 | generate coefficients | 10 13 6 |
| 332 | set first to 0 | first = 0 |
| 334 | produce a linear combination of packets | 9 6 8 2 13 10 |
| 336 | Transmit (L, R, r, data) | 1 4 503 9 6 8 2 13 10 |
| 338 | set M := M + rate | M = 4.500000 |

FIG. 7

| Step | Description | Data |
|---|---|---|
| 308 | form augmented packet | 4 2 1 6 |
| 310 | increment R | R = 5 |
| 312-316 | Adjust window | L = 2 |
| 316 | form padded packets in [L..R) window | 2 4 7 1 6 14<br>3 3 6 4 7 0<br>4 2 1 6 0 0 |
| 322-338 | generate coded packets | |
| 324 or 328 | generate seed | first = 1, seed = 0 |
| 326 or 330 | generate coefficients | 0 0 1 |
| 332 | set first to 0 | first = 0 |
| 334 | produce a linear combination of packets | 4 2 1 6 0 0 |
| 336 | Transmit (L, R, r, data) | 2 5 0 4 2 1 6 0 0 |
| 338 | set M := M + rate | M = 5.000000 |
| 324 or 328 | generate seed | first = 0, seed = 305 |
| 326 or 330 | generate coefficients | 14 10 9 |
| 332 | set first to 0 | first = 0 |
| 334 | produce a linear combination of packets | 0 1 12 3 1 11 |
| 336 | Transmit (L, R, r, data) | 2 5 305 0 1 12 3 1 11 |
| 338 | set M := M + rate | M = 5.500000 |

FIG. 8

| + | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| 0 | 0 | 1 | 2 | 3 | 4 | 5 | 6 | 7 | 8 | 9 | 10 | 11 | 12 | 13 | 14 | 15 |
| 1 | 1 | 0 | 3 | 2 | 5 | 4 | 7 | 6 | 9 | 8 | 11 | 10 | 13 | 12 | 15 | 14 |
| 2 | 2 | 3 | 0 | 1 | 6 | 7 | 4 | 5 | 10 | 11 | 8 | 9 | 14 | 15 | 12 | 13 |
| 3 | 3 | 2 | 1 | 0 | 7 | 6 | 5 | 4 | 11 | 10 | 9 | 8 | 15 | 14 | 13 | 12 |
| 4 | 4 | 5 | 6 | 7 | 0 | 1 | 2 | 3 | 12 | 13 | 14 | 15 | 8 | 9 | 10 | 11 |
| 5 | 5 | 4 | 7 | 6 | 1 | 0 | 3 | 2 | 13 | 12 | 15 | 14 | 9 | 8 | 11 | 10 |
| 6 | 6 | 7 | 4 | 5 | 2 | 3 | 0 | 1 | 14 | 15 | 12 | 13 | 10 | 11 | 8 | 9 |
| 7 | 7 | 6 | 5 | 4 | 3 | 2 | 1 | 0 | 15 | 14 | 13 | 12 | 11 | 10 | 9 | 8 |
| 8 | 8 | 9 | 10 | 11 | 12 | 13 | 14 | 15 | 0 | 1 | 2 | 3 | 4 | 5 | 6 | 7 |
| 9 | 9 | 8 | 11 | 10 | 13 | 12 | 15 | 14 | 1 | 0 | 3 | 2 | 5 | 4 | 7 | 6 |
| 10 | 10 | 11 | 8 | 9 | 14 | 15 | 12 | 13 | 2 | 3 | 0 | 1 | 6 | 7 | 4 | 5 |
| 11 | 11 | 10 | 9 | 8 | 15 | 14 | 13 | 12 | 3 | 2 | 1 | 0 | 7 | 6 | 5 | 4 |
| 12 | 12 | 13 | 14 | 15 | 8 | 9 | 10 | 11 | 4 | 5 | 6 | 7 | 0 | 1 | 2 | 3 |
| 13 | 13 | 12 | 15 | 14 | 9 | 8 | 11 | 10 | 5 | 4 | 7 | 6 | 1 | 0 | 3 | 2 |
| 14 | 14 | 15 | 12 | 13 | 10 | 11 | 8 | 9 | 6 | 7 | 4 | 5 | 2 | 3 | 0 | 1 |
| 15 | 15 | 14 | 13 | 12 | 11 | 10 | 9 | 8 | 7 | 6 | 5 | 4 | 3 | 2 | 1 | 0 |

FIG. 9

| × | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| 0 | 0 | 0 | 0 | 0 | 0 | 0 | 0 | 0 | 0 | 0 | 0 | 0 | 0 | 0 | 0 | 0 |
| 1 | 0 | 1 | 2 | 3 | 4 | 5 | 6 | 7 | 8 | 9 | 10 | 11 | 12 | 13 | 14 | 15 |
| 2 | 0 | 2 | 4 | 6 | 8 | 10 | 12 | 14 | 3 | 1 | 7 | 5 | 11 | 9 | 15 | 13 |
| 3 | 0 | 3 | 6 | 5 | 12 | 15 | 10 | 9 | 11 | 8 | 13 | 14 | 7 | 4 | 1 | 2 |
| 4 | 0 | 4 | 8 | 12 | 3 | 7 | 11 | 15 | 6 | 2 | 14 | 10 | 5 | 1 | 13 | 9 |
| 5 | 0 | 5 | 10 | 15 | 7 | 2 | 13 | 8 | 14 | 11 | 4 | 1 | 9 | 12 | 3 | 6 |
| 6 | 0 | 6 | 12 | 10 | 11 | 13 | 7 | 1 | 5 | 3 | 9 | 15 | 14 | 8 | 2 | 4 |
| 7 | 0 | 7 | 14 | 9 | 15 | 8 | 1 | 6 | 13 | 10 | 3 | 4 | 2 | 5 | 12 | 11 |
| 8 | 0 | 8 | 3 | 11 | 6 | 14 | 5 | 13 | 12 | 4 | 15 | 7 | 10 | 2 | 9 | 1 |
| 9 | 0 | 9 | 1 | 8 | 2 | 11 | 3 | 10 | 4 | 13 | 5 | 12 | 6 | 15 | 7 | 14 |
| 10 | 0 | 10 | 7 | 13 | 14 | 4 | 9 | 3 | 15 | 5 | 8 | 2 | 1 | 11 | 6 | 12 |
| 11 | 0 | 11 | 5 | 14 | 10 | 1 | 15 | 4 | 7 | 12 | 2 | 9 | 13 | 6 | 8 | 3 |
| 12 | 0 | 12 | 11 | 7 | 5 | 9 | 14 | 2 | 10 | 6 | 1 | 13 | 15 | 3 | 4 | 8 |
| 13 | 0 | 13 | 9 | 4 | 1 | 12 | 8 | 5 | 2 | 15 | 11 | 6 | 3 | 14 | 10 | 7 |
| 14 | 0 | 14 | 15 | 1 | 13 | 3 | 2 | 12 | 9 | 7 | 6 | 8 | 4 | 10 | 11 | 5 |
| 15 | 0 | 15 | 13 | 2 | 9 | 6 | 4 | 11 | 1 | 14 | 12 | 3 | 8 | 7 | 5 | 10 |

FIG. 10

$$\begin{pmatrix} & L_D & M_D & & & & & & packets & & & & & \\ & 1 & & & & & & & b & b & b & b & b & b & \dots \\ & & 1 & & & & & & b & b & b & b & b & \dots \\ L_D & & 1 & & & & & & b & b & b & b & b & \dots \\ & & & 1 & & & & & b & b & b & b & b & \dots \\ & & & & 1 & & & & b & b & b & b & b & \dots \\ M_D & & & c & c & c & c & c & b & b & b & b & b & \dots \\ & & & & c & c & c & c & b & b & b & b & b & \dots \\ & & & & & c & c & b & b & b & b & b & \dots \\ & & & & & & c & b & b & b & b & b & \dots \\ L_D + W_D & & & & & & & & & & & & & \end{pmatrix}$$

FIG. 11

| Step | Description | Data |
|---|---|---|
| 1220 | augment decoding matrix | 13 7 0 0 \| 3 11 11 11 13 12 |
| 1222 | reduce to row echelon form | |
| 1224 | decoding matrix | 13 7 0 0 \| 3 11 11 11 13 12 |

FIG. 14

| Step | Description | Data |
|---|---|---|
| 1220 | augment decoding matrix | 13 7 0 0 \| 3 11 11 11 13 12<br>0 0 1 0 \| 3 3 6 4 7 0 |
| 1222 | reduce to row echelon form | |
| 1224 | decoding matrix | 13 7 0 0 \| 3 11 11 11 13 12<br>0 0 1 0 \| 3 3 6 4 7 0 |

FIG. 15

| Step | Description | Data |
|---|---|---|
| 1220 | augment decoding matrix | 13 7 0 0 \| 3 11 11 11 13 12<br>0 0 1 0 \| 3 3 6 4 7 0<br>10 13 6 0 \| 9 6 8 2 13 10 |
| 1222 | reduce to row echelon form | using A(0,0) to clear A(2,0)<br>swapping A(1,:) and A(2,:) |
| 1224 | decoding matrix | 13 7 0 0 \| 3 11 11 11 13 12<br>0 1 6 0 \| 8 14 0 10 7 14<br>0 0 1 0 \| 3 3 6 4 7 0 |
| note | rows [ 0 - 3 ) now decodable | scale A(0,0)<br>sub A(2,2) to clear A(1,2)<br>sub A(1,1) to clear A(0,1) |
| 1226 | decoding matrix | 1 0 0 0 \| 1 3 1 5 5 0<br>0 1 0 0 \| 2 4 7 1 6 14<br>0 0 1 0 \| 3 3 6 4 7 0 |
| 1230 | deliver packet 1, length 3 | 1 5 5 |
| 1230 | deliver packet 2, length 4 | 7 1 6 14 |
| 1230 | deliver packet 3, length 3 | 6 4 7 |

FIG. 16

| Step | Description | Data |
|---|---|---|
| 1212-1214 | adjust decoding window | $L_D$ 1 changed to 2 |
| 1220 | augment decoding matrix | 1 0 0 0 \| 1 3 1 5 5 0<br>0 1 0 0 \| 2 4 7 1 6 14<br>0 0 1 0 \| 3 3 6 4 7 0<br>0 0 0 1 \| 4 2 1 6 0 0 |
| 1222 | reduce to row echelon form | |
| 1224 | decoding matrix | 1 0 0 0 \| 1 3 1 5 5 0<br>0 1 0 0 \| 2 4 7 1 6 14<br>0 0 1 0 \| 3 3 6 4 7 0<br>0 0 0 1 \| 4 2 1 6 0 0 |
| note | rows [ 3 - 4 ) now decodable | |
| 1226 | decoding matrix | 1 0 0 0 \| 1 3 1 5 5 0<br>0 1 0 0 \| 2 4 7 1 6 14<br>0 0 1 0 \| 3 3 6 4 7 0<br>0 0 0 1 \| 4 2 1 6 0 0 |
| 1230 | deliver packet 4, length 2 | 1 6 |

ERROR-CORRECTING CODE

CROSS-REFERENCE TO RELATED APPLICATIONS

The present application is a divisional application under 35 U.S.C § 121 of U.S. Nonprovisional application Ser. No. 14/206,435, filed Mar. 12, 2014, which claims the benefit of U.S. Provisional Application No. 61/786,594, filed Mar. 15, 2013. The nonprovisional application and the provisional application, including any appendices or attachments thereof, are hereby incorporated by reference in their entirety.

BACKGROUND

Error-correcting codes are used to reduce the error rate of communication over noisy channels. A typical error-correcting code transmits more symbols than strictly necessary so that reception of a corrupted stream of symbols still allows the original message to be reconstructed as long as the corruption is not too large.

An error-correcting code has a fixed rate when the code has a fixed ratio of the number of source symbols to the number of transmitted symbols. An error-correcting code has variable rate when the code allows the rate to change during the transmission. For example, the rate may adapt to varying conditions in the communication channel.

Typical variable rate codes have a long decoding delay where a substantial portion of the message is received in order to decode the first symbol. While this may not be a problem for file transmission, this delay is undesirable if the message is some real-time audio or video stream, such as a message for a video conference. One way to avoid this problem is by using a sliding window where the transmitted symbols are a function of a contiguous, small segment of the source message (the window). The window initially encompasses a prefix of the message, and it is moved forward as the transmission progresses.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are therefore not to be considered limiting of its scope, the disclosure will be described with additional specificity and detail through use of the accompanying drawings.

In the drawings:

FIGS. 5, 6, 7, and 8 demonstrate the encoding method of FIGS. 3 and 4 in examples of the present disclosure.

FIGS. 9 and 10 show addition and multiplication tables for the Galois field GF(16), respectively.

FIG. 11 shows a decoding matrix maintained by the decoder of FIG. 1 in examples of the present disclosure.

FIGS. 14, 15, 16, and 17 demonstrate the decoding method of FIGS. 12 and 13 in examples of the present disclosure.

FIG. 18 is a block diagram of a computing device for implementing the encoder or the decoder of FIG. 1 in examples of the present disclosure.

DETAILED DESCRIPTION

As used herein, the term "includes" means includes but not limited to, the term "including" means including but not limited to. The terms "a" and "an" are intended to denote at least one of a particular element. The term "based on" means based at least in part on. The term "or" is used to refer to a nonexclusive such that "A or B" includes "A but not B," "B but not A," and "A and B" unless otherwise indicated.

In examples of the present disclosure, method and apparatus are provided to generate and decode an error-correcting code. The code may operate on top of the Internet Protocol (IP) so it may be implemented in software, hardware, or a combination thereof without any changes to the existing Internet infrastructure.

High-Level Description

Figure 1:
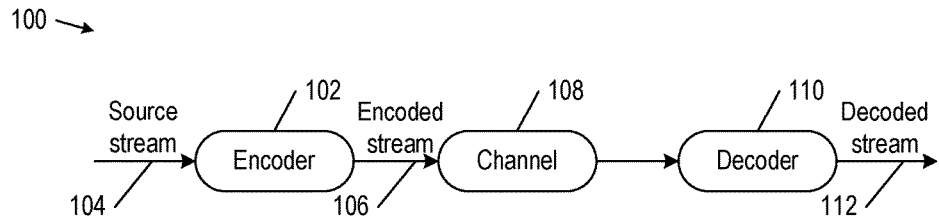
FIG. 1 is a block diagram of a system with an encoder and a decoder in examples of the present disclosure.

FIG. 1 is a block diagram of a system 100 in examples of the present disclosure. System 100 includes an encoder 102 that processes a source stream 104 (e.g., from a video codec connected to a video camera) to produce an encoded stream 106. Source stream 104 may be in the form of packets of variable size. If source stream 104 is a pure byte stream, encoder 102 may select a convenient packet size. Encoder 102 transmits encoded stream 106 via a communication channel 108 to a decoder 110, which returns a decoded stream 112 (e.g., to a video codec connected to a video sink) that should be equal to source stream 104. Source stream 104 includes a sequence of packets. Packets in source stream 104 may be of different lengths. Channel 108 may delete, delay, reorder, or duplicate packets in encoded stream 106. Channel 108 may not deliver damaged packets, which are to be detected and deleted by an error detection mechanism in channel 108 such as packet checksums or cyclic redundancy check (CRC) codes.

Both encoder 102 and decoder 110 agree in advance on a finite field F to be used for encoding operations. The finite field F may be the Galois field $GF(2^8)$. Encoder 102 and decoder 110 also agree on a pseudorandom number generator (PRNG) that generates pseudorandom values in the finite field F.

Encoder 102 operates on source packets $s_i$ in a sliding encoder window $L \leq i < R$, where L, i, and R are notional sequence numbers of the packets used to control the operation of encoder 102. Notional sequence numbers may be selected by encoder 102 as they do appear in source stream 104 and decoder 110 does not pass them in decoded stream 112. Encoder 102 chooses W=R−L pseudorandom coefficients $c_i$, multiplies each source packet $s_i$ by one corresponding coefficient, and transmits the sum of these products. As source packets $s_i$ have varying lengths, a conventional encoder may transmit the length of source packets $s_i$ separately, causing a protocol overhead proportional to encoder window size W. In contrast, encoder 102 has a constant overhead independent of encoder window size W. Instead of encoding source packet $s_i$, encoder 102 encodes the vector $(l_i, s'_i)$, where $l_i$ is the length of source packet $s_i$, and $s'_i$ is source packet $s_i$ padded with enough zeros (0's) so that all packets s'$_i$ in the encoder window have the same length. For example, the vector (l$_i$, s'$_i$) includes (l$_L$, s'$_L$) (l$_{L+1}$, s'$_{L+1}$) (l$_{L+2}$, s'$_{L+2}$) ... (l$_{R-1}$, s'$_{R-1}$).

Decoder 110 reconstructs the vector (l$_i$, s'$_i$), which is sufficient to reconstruct source packet s$_i$ uniquely. Decoder 110 receives linear combinations of source packets s$_i$ and decodes them by solving a system of linear equations. A conventional decoder may use Gauss-Jordan elimination to solve the system of linear equations. In contrast, decoder 110 may use lower upper (LU) decomposition to solve the system of linear equations. To decode N packets of a length k, the conventional decoder uses a time proportional to N*(N*N+N*k), whereas decoder 110 uses a time W*(N*N+N*k) that is much smaller as long as the encoder window is not too large. Note that decoder 110 may use other methods to solve systems of linear equations.

For each received packet, decoder 110 knows the encoder window size W and the starting position L of the encoder window. Encoder 102 transmits these values as overhead to decoder 110. Decoder 110 also knows the pseudorandom encoding coefficients. Encoder 102 uses coefficients drawn from the PRNG. Decoder 110 has a copy of the PRNG, which will generate the same sequence of coefficients provided that the decoder's PRNG has the same internal state as the encoder's PRNG. The internal states can be synchronized by transmitting the seed of the encoder's PRNG, transmitting the internal state of the encoder's PRNG as overhead, or, for fixed PRNGs, transmitting the starting sequence number of the encoder's PRNG used for a particular packet.

Encoder State

In examples of the present disclosure, encoder 102 maintains the following state variables:

L: An integer, mnemonic for "left" boundary of the encoder window, and initially set to 1 (or another number depending on the notional sequence value of the very first source packet).

R: An integer, mnemonic for "right" boundary of the encoder window, and initially set to 1 (or another number depending on the notional sequence value of the very first source packet).

M: A real number representing encoding progress, initially set to 1 (or another number depending on the notional sequence value of the very first source packet), and may be a rational number or a fraction with constant denominator.

During its operation, encoder 102 generates combinations of source packets s$_i$ in the encoder window L≤i<R.

In examples of the present disclosure, the following two parameters control the operation of encoder 102:

rate: A real number 0<rate≤1 that is the "rate" of the error-correcting code. For each coded packet, encoder 102 consumes rate source packets. Equivalently, for each source packet, encoder 102 produces 1/rate coded packets.

W$_E$: The maximum encoder window size. During normal operation, 0≤R−L≤W$_E$.

In examples of the present disclosure, the encoding rate and the maximum encoder window size W$_E$ may vary with time. A lower encoding rate is appropriate for conditions with greater error rates, and a larger encoder window is appropriate for situations that can tolerate extra decoding latency.

Operation of the Encoder

Figure 2:
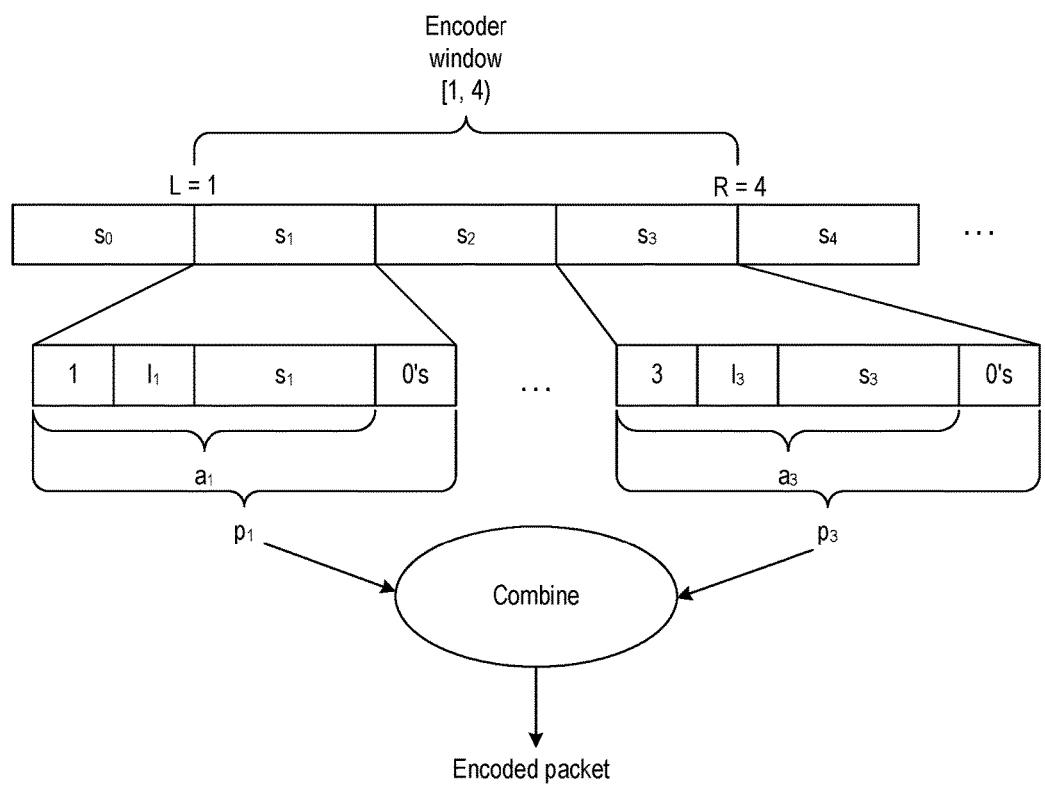
FIG. 2 is a block diagram illustrating the operation of the encoder of FIG. 1 in examples of the present disclosure.

FIG. 2 is a block diagram illustrating the operation of encoder 102 in examples of the present disclosure. Encoder 102 maintains an encoder window [L, R) of source packets s$_i$. For example, encoder window [1, 4) includes source packets s$_1$, s$_2$, and s$_3$. Encoder 102 augments source packet s$_i$ to form augmented packets a$_i$ by prepending to each source packet s$_i$ its length l$_i$. Optionally encoder 102 also prepends to each source packet s$_i$ its notional sequence number i. Encoder 102 pads source packet s$_i$ to form padded packets p$_i$ by appending augmented packets a$_i$ with zeroes (0's), if necessary, so all padded packets p$_i$ in encoder window [L, R) have the same length. Encoder 102 outputs linear combinations of all padded packets p$_i$.

When encoder 102 receives a new source packet s$_i$ from the source stream 104, encoder 102 may operate as follows in examples of the present disclosure.

1. (Formation of the augmented packet) Assume that the encoder receives source packet s$_i$, the ith packet in source stream 102. Let l$_i$ be the length of source packet s$_i$.

Encoder 102 forms an augmented packet a$_i$=(i, l$_i$, s$_i$). That is, augmented packet a$_i$ includes the notional sequence number i of source packet s$_i$, length l$_i$ of source packet s$_i$, and source packet s$_i$ itself. Notional sequence number i is optionally and may be used for debugging. See, for example, augmented packets a$_1$ and a$_3$ in FIG. 2.

2. Increment R to advance the right edge of the encoder window in time.

3. (Adjust encoder window) If R−L>W$_E$, increment L to keep the encoder window smaller than the maximum encoder window size W$_E$.

4. (Formation of padded packets) Let k be the largest length of augmented packets a$_i$ in encoder window L≤i<R. For each augmented packet a$_i$ in encoder window L≤i<R, form a padded packet p$_i$ by extending a$_i$ with zeros until it has length k. Here, "zero" is the zero of the finite field F. See, for example, padded packets p$_1$ and p$_3$ in FIG. 2.

5. Let first=true. The variable "first" is used to determine if a padded packet p$_i$ is encoded for the first time.

6. (Generate coded packets) While M≤R do the following:

a) (Choice of pseudorandom seed) If first is true, let r=0. Otherwise, let r be an arbitrary nonzero random seed.

This logic, in combination with the next step, encodes a padded packet by itself when padded packet p$_i$ is encoded for the first time. Otherwise padded packet p$_i$ is encoded by combining it with all other padded packets in the encoder window.

b) (Generation of pseudorandom numbers) If r≠0, use r to generate random coefficients c$_i$∈F for L≤i<R.

Otherwise (r=0), let c$_i$=0 for L≤i<R<1, and let c$_{R-1}$=1$_F$. Here, 1$_F$ is the multiplicative identity of F.

c) Set first:=false.

d) (Produce a linear combination of padded packets) Interpreting padded packets p$_i$ as elements over the vector space F$^k$, compute:

$$b = \sum_{L \le i < R} c_i p_i. \quad (1)$$

Thus the first byte of encoded packet b is the inner product of the coefficient vector c and the vector composed of the first bytes of the padded packets p where the arithmetic uses addition and multiplication in the chosen Galois field. In other words each value in the first padded packet is multiplied by the first coefficient, each value in the second padded packet is multiplied by the second coefficient, and so forth. Each value in encoded packet b is the sum of the corresponding symbols in the multiplied packets.

e) (Transmit) Send the tuple (L, R, r, b) over channel 108. The tuple may also be referred to as the coded packet. In some examples, data-compressed or implicit versions of (L, R, r) are transmitted. Implicit transmission may include transmitting a value in a packet checksum without actually transmitting the value where decoder 110 searches for a value that makes the checksum correct f) (Increment M) Set M:=M+rate. The use of R, M, and the encoding rate allows each padded packet $p_i$ to be encoded once by itself and with other padded packets in the encoder window a number of times ($\geq 0$) after the first time.

Figure 3:
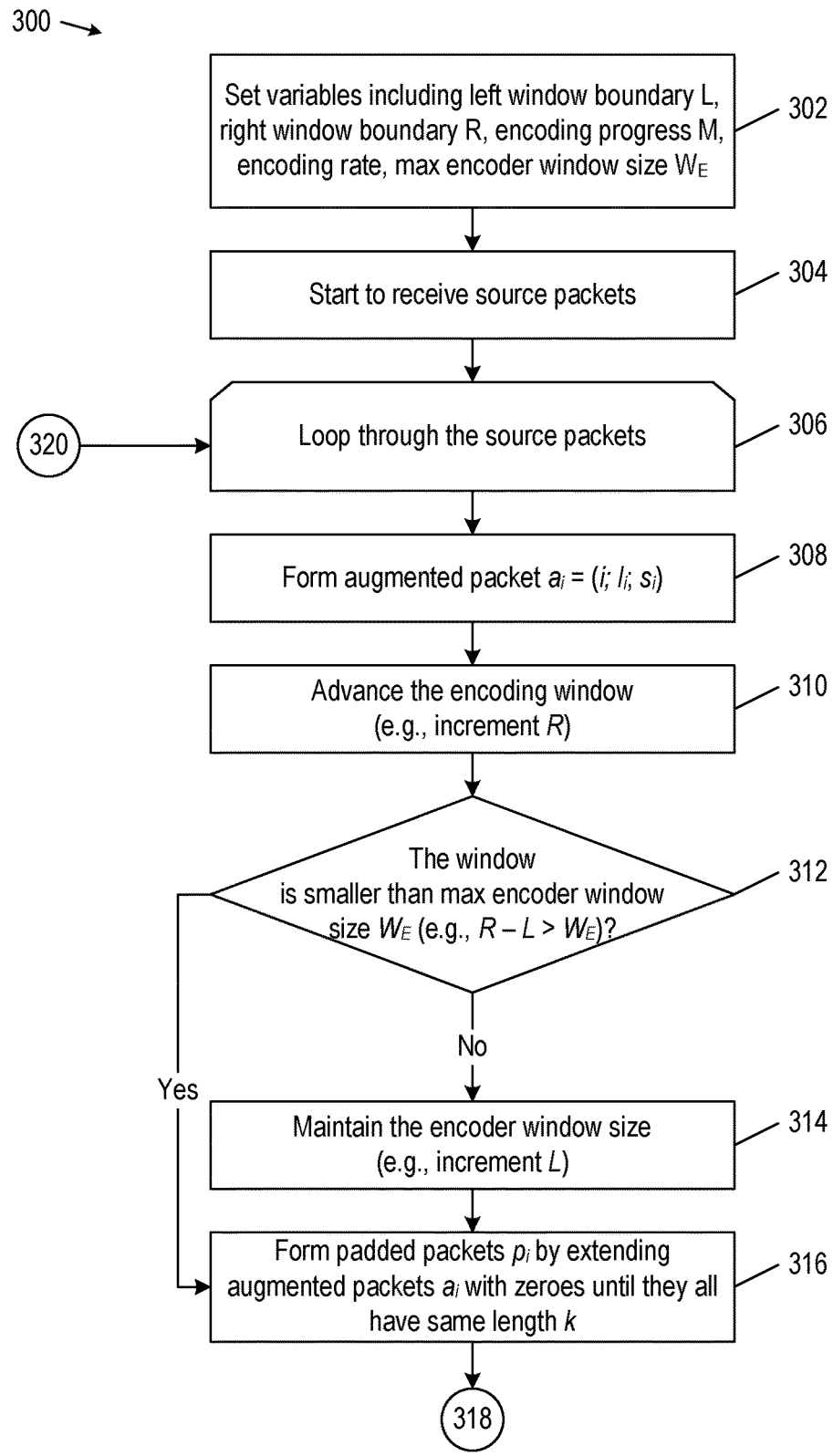
FIGS. 3 and 4 are a flowchart of a method for the encoder of FIG. 1 to transmit an error-correcting code in examples of the present disclosure.
Figure 4:
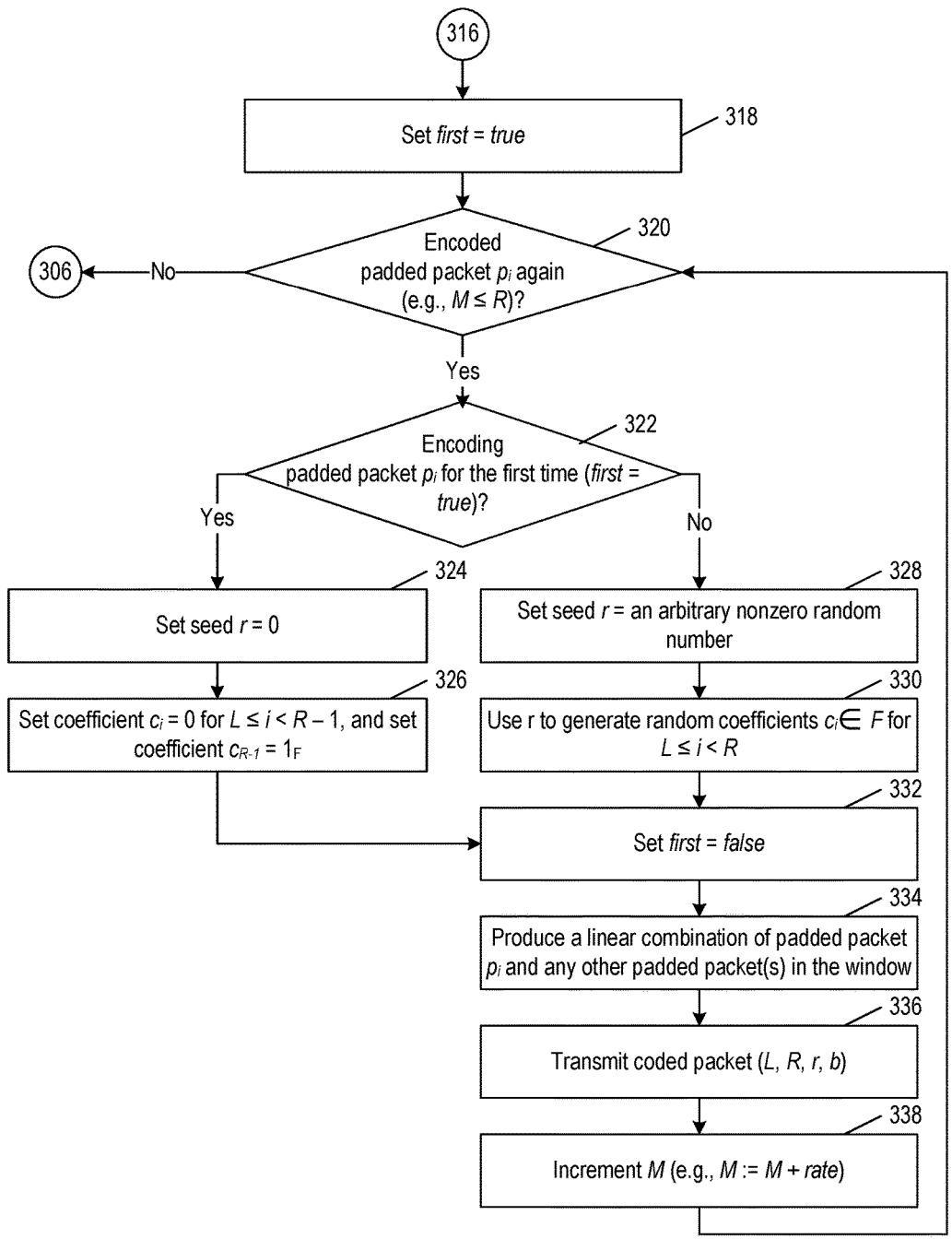

FIGS. 3 and 4 show a flowchart of a method 300 for encoder 102 to transmit an error-correcting code in examples of the present disclosure. Method 300 may begin in block 302 in FIG. 3.

In block 302, encoder 102 sets variables left encoder window boundary L, right encoder window boundary R, encoding progress M, the encoding rate, and the maximum encoder window size $W_E$. Block 302 may be followed by block 304.

In block 304, encoder 102 starts to receive source packets $s_i$ in source stream 104. Block 304 may be followed by block 306.

In block 306, encoder 102 starts to loop through source packets $s_i$ in their notional sequence. Block 306 may be followed by block 308.

In block 308, encoder 102 forms an augmented packet $a_i=(i, l_i, s_i)$ based on source packet si. Block 308 may be followed by block 310.

In block 310, encoder 102 advances the encoder window by incrementing the encoder window right boundary R. Block 310 may be followed by block 312.

In block 312, encoder 102 determines if the encoder window is smaller than the maximum encoder window size $W_E$. If so, then block 312 may be followed by block 316. Otherwise block 312 may be followed by block 314.

In block 314, encoder 102 maintains the encoder window size by incrementing the encoder window left boundary L. Block 314 may be followed by block 316.

In block 316, encoder 102 determines the largest length k of augmented packets $a_i$ in encoder window $L \leq i < R$ and pads augmented packets $a_i$ by appending them with zeros until they all have length k. Block 316 may be followed by block 318 in FIG. 4.

In block 318, encoder 102 sets variable first to true (e.g., 1) to denote padded packet $p_i$ is to be encoded for the first time. As described later, encoder 102 sets variable first to false (e.g., 0) after encoding padded packet $p_i$ for the first time. Block 318 may be followed by block 320.

In block 320, encoder 102 determines if padded packet $p_i$ is to be encoded (again). If so, block 320 may be followed by block 322. Otherwise block 320 may be followed by block 306 to select the next source packet $s_i$ to process.

Padded packet $p_i$ is to be encoded (again) when it has not been encoded for a certain number of times. Encoder 102 uses encoding progress M to make this determination. As described later, encoder 102 increments encoding progress M by the encoding rate after encoding padded packet $p_i$. Encoder 102 encodes padded packet $p_i$ (again) while encoding progress M is less than or equal to the encoder window right boundary R.

In block 322, encoder 102 determines if padded packet $p_i$ is to be encoded for the first time. In other words, encoder 102 determines if variable first is set as true. If so, block 322 may be followed by block 324. Otherwise block 322 may be followed by block 328.

In block 324, encoder 102 sets a seed r for the PRNG to zero (0) to indicate padded packet $p_i$ is to be encoded by itself without any other earlier padded packets $p_i$ in the encoder window. Block 324 may be followed by block 326.

In block 326, encoder 102 sets $c_i=0$ for $L \leq i < R-1$, and sets $c_{R-1}=1_F$ where $1_F$ is the multiplicative identity of F. Block 326 may be followed by block 332.

In block 328, encoder 102 lets seed r for the PRNG to be an arbitrary nonzero random number. Block 328 may be followed by block 330.

In block 330, encoder 102 uses seed r to generate pseudorandom coefficients $c_i$, where $c_i \in F$ for $L \leq i < R$. Block 330 may be followed by block 332.

In block 332, encoder 102 sets variable first to false (e.g., 0). Block 332 may be followed by block 334.

In block 334, encoder 102 linearly combines the products of coefficients $c_i$ and corresponding padded packets $p_i$ in the encoder window per equation 1 to form an encoded packet b. Padded packets $p_i$ in the encoder window includes the current padded packet $p_{R-1}$ and earlier padded packets $p_L \ldots p_{R-2}$ in the encoder window. Block 334 may be followed by block 336.

In block 336, encoder 102 transmits a tuple (L, R, r, b) as a coded packet over communication channel 108. Block 336 may be followed y block 338.

In block 338, encoder 102 increments encoding progress M by the encoding rate. Block 338 may be followed by block 320 to determine if padded packet $p_i$ is to be encoded again.

Demonstration of the Encoding Process

FIGS. 5, 6, 7, and 8 demonstrate method 300 transmitting a message in examples of the present disclosure. In this demonstration, encoder 102 (FIG. 1) uses the GF(16) field where each symbol in the field may be represented as a 4-bit number from 0000 to 1111 or 0 to 15 in decimal.

For the demonstration, assume encoder 102 is to transmit the message "Quanta." This message is 6 characters long, and each character is 8 bits according to the ASCII code. Each character in the message may be represented by its low 4 bits followed by its high 4 bits. For example, "Q" has ASCII code 0x51, which can be represented by the two symbol message 1 5, and the entire message "Quanta" becomes 1 5 5 7 1 6 14 6 4 7 1 6. Assume this 12 symbol message is divided into notional source packets of random lengths 3, 4, 3, and 2 as shown in Table 1.

TABLE 1

| Packet | Length | Data |
|--------|--------|------|
| 1 | 3 | 1 5 5 |
| 2 | 4 | 7 1 6 14 |
| 3 | 3 | 6 4 7 |
| 4 | 2 | 1 6 |

As the message has been divided into 4-bit symbols, they can be represented as symbols in the GF(16) field. These source packets are sent sequentially to encoder 102.

In FIGS. 5, 6, 7, and 8, the generation of pseudorandom coefficients in the encoding process is shown as steps 324/328 and 326/330, and the production of a linear combination of padded packets is shown in step 334. As described above, encoder 102 generates pseudorandom coefficients using a PRNG. When set to a particular seed value, the PRNG produces the same set of pseudorandom numbers thereafter until the seed is changed. Encoder 102 transmits the seed values used to generate the encoded packets to decoder 110 so the decoder's PRNG is synchronized with the encoder's PRNG even if packets are lost or delivered out of order. In examples of the present disclosure, the PRNG does not output any zeroes (0's) because a zero (0) is not an advantageous coefficient. Also as described above, zero (0) is not used as a seed value because encoder 102 sets seed r to zero (0) to indicate a padded packet is to be encode by itself.

The encoded packets are formed by random linear combinations of padded packets based on the pseudorandom coefficients. Consider two padded packets e and f with two coefficients $c_1$ and $c_2$, the linear combination of $c_1 e + c_2 f$ is calculated according to the rules for Galois field arithmetic. FIGS. 9 and 10 show addition and multiplication tables for the GF(16) field, respectively.

FIG. 5 shows the processing of source packet $s_1$, which has a length 3 and data 1 5 5, in examples of the present disclosure. Initially encoder 102 sets encoder window left boundary L to 1, encoder window right boundary to 1, encoding progress M to 1, the encoding rate to 0.5, and the maximum encoder window size $W_E$ to 3. Encoder 102 forms an augmented packet $a_1$ based on source packet $s_1$, and a padded packet $p_1$ based on augmented packet $a_1$. Note that encoder 102 does not append augmented packet $a_1$ with any zeroes (0's) as there is only one augmented packet in encoder window [1, 1) so there is no need to make all padded packets $p_i$ in encoder window [1, 1) the same length. Also note that encoder 102 increments the encoder window right boundary R after augmented packet $a_1$ is formed to advance encoder window to [1, 2).

Padded packet $p_1$ is encoded three times. When padded packet $p_1$ is encoded for the first time, seed r is set to zero (0) so padded packet $p_1$ is "encoded" by itself with an identity coefficient so the encoded packet is the same as the padded packet. When padded packet $p_1$ is encoded each subsequent time, seed r is set to a random number and a pseudorandom coefficient is generated with the PRNG based on seed r. As there are no earlier padded packets $p_i$ in encoder window [1, 2), equation (1) only produces the product of padded packet $p_1$ and the pseudorandom coefficient. Each time after padded packet $p_1$ is encoded, encoding progress M is incremented by the encoding rate. Once encoding progress M is greater than the encoder window right boundary R, encoder 102 processes the next source packet.

FIG. 6 shows the processing of source packet $s_2$, which has a length 4 and data 7 1 6 14, in examples of the present disclosure. Encoder 102 forms an augmented packet $a_2$ based on source packet $s_2$, and a padded packet $p_2$ based on augmented packet $a_2$. Encoder 102 increments the encoder window right boundary R after augmented packet $a_2$ is formed to advance encoder window to [1, 3). Encoder 102 appends augmented packet $a_1$ with one zero (0) so padded packets $p_1$ and $p_2$ in encoder window [1, 3) have the same length.

Padded packet $p_2$ is encoded two (2) times. When padded packet $p_2$ is encoded for the first time, seed r is set to zero (0) so the padded packet is "encoded" by itself with an identity coefficient so the encoded packet is the same as the padded packet. When padded packet $p_2$ is encoded for the second time, seed r is set to a random number and two (2) pseudorandom coefficients are generated with the PRNG based on seed r. The products of padded packet $p_1$, $p_2$ and the two pseudorandom coefficients are linearly combined per equation (1).

FIG. 7 shows the processing of source packet $s_3$, which has a length 3 and data 6 4 7, in examples of the present disclosure. Encoder 102 forms an augmented packet $a_3$ based on source packet $s_3$, and a padded packet $p_3$ based on augmented packet $a_3$. Encoder 102 increments the encoder window right boundary R after augmented packet $a_3$ is formed to advance encoder window to [1, 4). Encoder 102 appends augmented packets $a_1$ and $a_3$ with one zero (0) so padded packets $p_1$, $p_2$, and $p_3$ in encoder window [1, 4) have the same length.

Padded packet $p_3$ is encoded two (2) times. When padded packet $p_3$ is encoded for the first time, seed r is set to zero (0) so the padded packet is "encoded" by itself with an identity coefficient so the encoded packet is the same as the padded packet. When padded packet $p_3$ is encoded for the second time, seed r is set to a random number and three (3) pseudorandom coefficients are generated with the PRNG based on seed r. The products of padded packet $p_1$, $p_2$, $p_3$ and the three pseudorandom coefficients are linearly combined per equation (1).

FIG. 8 shows the processing of source packet $s_4$, which has a length 2 and data 1 6, in examples of the present disclosure. Encoder 102 forms an augmented packet $a_4$ based on source packet $s_4$, and a padded packet $p_4$ based on augmented packet $a_4$. Encoder 102 increments the encoder window right boundary R after augmented packet $a_4$ is formed to advance encoder window to [1, 5). Encoder window left boundary is incremented from 1 to 2 to maintain the maximum encoder window size $W_E$. Encoder 102 appends augmented packets $a_3$ and $a_4$ with one zero (0) so padded packets $p_2$, $p_3$, and $p_4$ in encoder window [2, 5) have the same length.

Padded packet $p_3$ is encoded two (2) times. When padded packet $p_3$ is encoded for the first time, seed r is set to zero (0) so the padded packet is "encoded" by itself with an identity coefficient so the encoded packet is the same as the padded packet. When padded packet $p_3$ is encoded for the second time, seed r is set to a random number and three (3) pseudorandom coefficients are generated with the PRNG based on seed r. The products of padded packet $p_1$, $p_2$, $p_3$ and the three pseudorandom coefficients are linearly combined per equation (1).

Overview of the Decoder Decoder 110 receives tuples ($L_E$, $R_E$, r, b) transmitted by encoder 102 in step 6e and reconstructs source packets. Hereafter variables with the subscript "E" is the encoder's value the subscript "D" is the decoder's value. To reconstruct the source packets, decoder 110 maintains a decoding matrix 1100 as shown in FIG. 11 in examples of the present disclosure.

Recall that encoder 102 combines padded packets according to equation (1). Thus, encoder 102 computes B=AX, where A is a matrix of pseudorandom coefficients computed by the PRNG, X is a matrix whose rows are the padded packets (a column vector of padded packets), and B is the matrix computed with equation (1) (a column vector of encoded packets).

In principle, A, B, and X are infinite matrices. Decoder 110, however, keeps only a submatrix $A_{ij}$ of A for L≤j<L+$W_D$, for some window size $W_D$. Window size $W_D$ may be set at least as large as the maximum encoder window size $W_E$, and possibly larger.

When receiving a tuple ($L_E$, $R_E$, r, b), decoder 110 reconstructs the coefficients c that were computed by encoder 102 in step 6b, and enters the pseudorandom coefficients c and the encoded packet b as a new row of decoding matrix 1100.

Then decoder 110 reduces decoding matrix 1100 to row-echelon form. A matrix is in row-echelon form if the leading coefficient of a row is strictly to the right of the leading coefficient of all rows above it, where the leading coefficient of a row is the leftmost nonzero entry in the row.

A submatrix of A is said to be decodable up to row $M_D{'}$ if all diagonal entries $A_{ii}$ are nonzero for $i<M_D{'}$ and if is zero for $i<M_D{'}$ and $j \geq M_D{'}$. Thus, the matrix $$\begin{pmatrix} c & c & & \\ & c & & \\ & & c & c \end{pmatrix}$$

is decodable up to row 2 but not up to row 3 because of the second coefficient c in the third row cannot be cancelled with the fourth row because the fourth row is not yet populated.

Whenever a submatrix of A is decodable up to row $M_D{'}$, the first $M_D{'}$ rows may be reduced to the identity via backward substitution, allowing the first $M_D{'}$ padded packets to be decoded.

In examples of the present disclosure, decoder 110 operates via the row-echelon form (REF) plus backward substitution, whereas a conventional decoder reduces the matrix to reduced row echelon form (RREF). The REF may be much better than the RREF in exploiting the banded structure of the matrices used by encoder 102.

Referring to FIG. 11, decoder 110 maintains decoding matrix 1110 in examples of the present disclosure. An empty entry denotes a zero (0), a "c" denotes a coefficient, and a "b" denotes a data item from a coded packet received from channel 108. Decoding matrix 1110 has the form [A∥B], where the A's are pseudorandom coefficients and the B's are data elements. Decoder 110 is to solve the system of equations AX=B for X, where B are the encoded packets received from channel 108, X is the reconstruction of the source packets, and A is the matrix of pseudorandom coefficients (1, 0, and c in FIG. 11). Each row corresponds to a decoded packet, and each column corresponds to a source packet. Decoder 110 maintains A in row-echelon form, as shown in FIG. 11. Whenever possible, decoder 110 reduces a prefix of decoding matrix 1100 to the identity matrix, for i, $j<M_D$. When this happens, source packet i for $i<M_D$ has been decoded. The A matrix is in principle infinite, but decoder 110 only maintains a sliding decoder window of rows/columns i in the range $L_D \leq i < L_D + W_D$.

Operation of the Decoder

Decoder 110 maintains the decoding matrix 1100 as discussed above, with the associated state variables decoder window left boundary $L_D$ and decoding progress $M_D$ that are initially set to encoder window left boundary $L_E$ in the tuple received. Decoder 110 stores rows/columns $[L_D, L_D+W_D)$ of the matrix A, and decoding matrix 1100 is always decoded up to row $M_D$, and decodable up to row $M_D{'}$.

When receiving a tuple ($L_E$, $R_E$, r, b), the decoder operates as follows:

1. (Drop old packets) If $L_E < L_D$ stop. The packet is too old to be decoded given decoder window size $W_D$.
2. (Adjust decoding window) If $R_E > L_D + W_D$, set $L_D = R_E - W_D$. After this step, $R_E L_D + W_D$ and the received tuple falls within the decoder window.
3. (Notification of losses) If $M_D < L_D$, then notify the user that source packets $[M_D, L_D)$ have been lost, and set $M_D := L_D$. The user may be another application, such as a video codec.
4. (Augment decoding matrix) Generate coefficients c as in step 6b of decoder 102. Add c and b to the first zero row of decoding matrix 1100.
5. (Reduce to row-echelon form) Reduce A to row-echelon form via elementary row operations. Apply the same row updates to both matrices A and B.
6. (Batch decode) Let $M_D{'}$ be the maximum integer that matrix A is decodable up to $M_D{'}$th row.
   If $M_D{'} > M_D$, decode encoded packets in the range $[M_D, M_D{'})$ via backward substitution.
7. (Deliver decoded packets) While $M_D < M_D{'}$ do the following:
   a) The $M_D$th row of matrix B contains the $M_D$th padded packet $p_m$. Extract the source packet from padded packet $p_m$ and deliver it to the user.
   b) Increment $M_D$.

Figure 12:
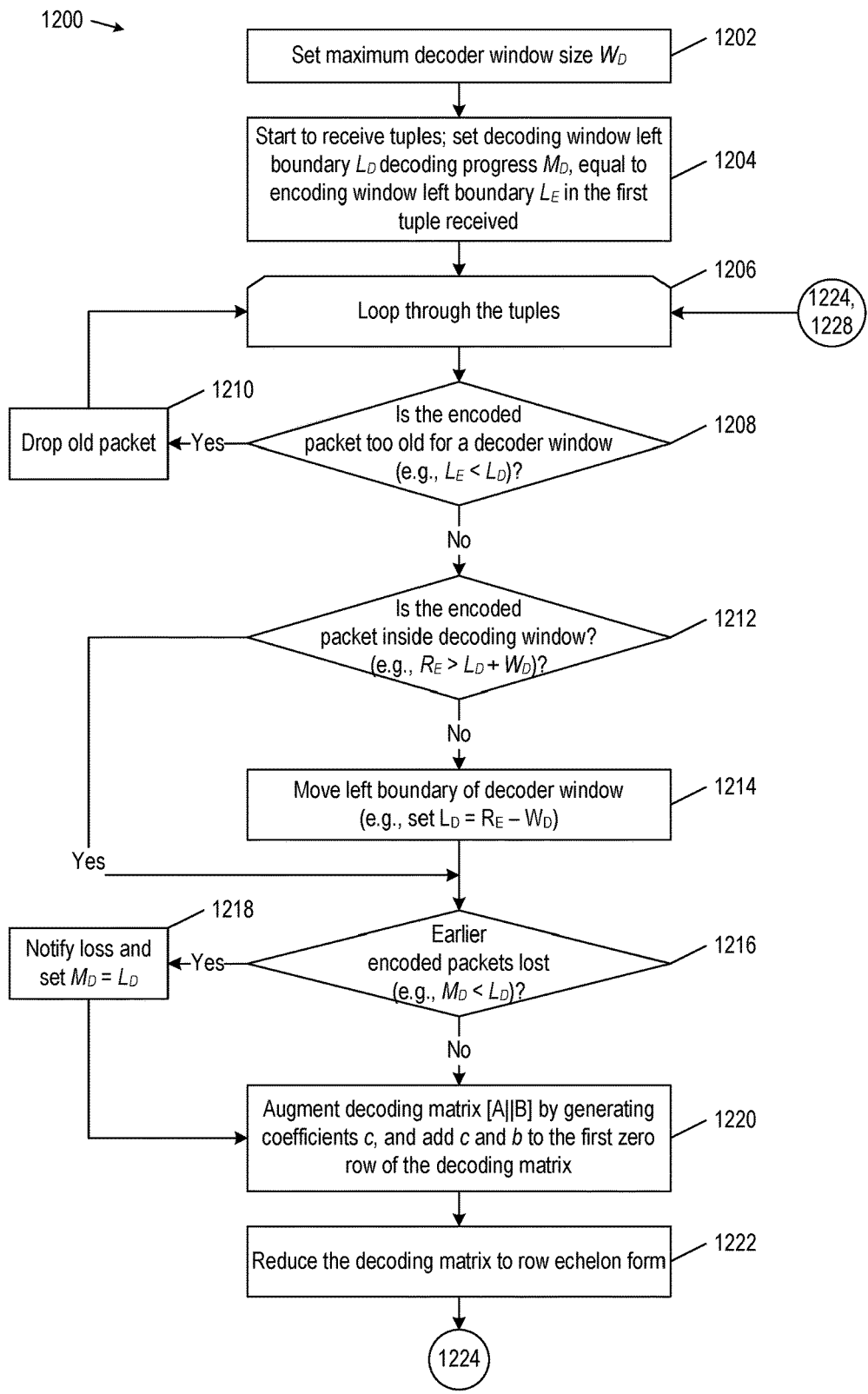
FIGS. 12 and 13 are a flowchart of a method for the decoder of FIG. 1 to decode an error-correcting code in examples of the present disclosure.
Figure 13:
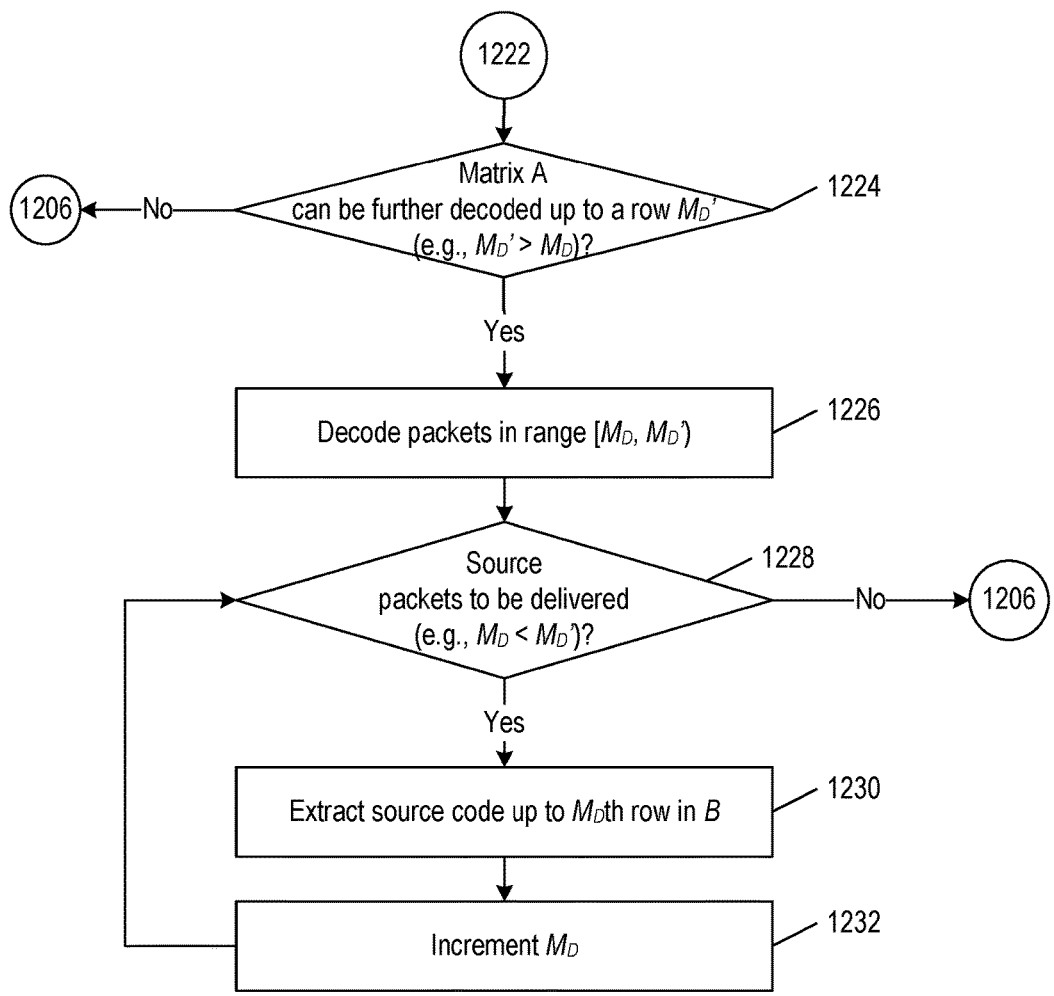

FIGS. 12 and 13 are a flowchart of a method 1200 for decoder 110 (FIG. 1) to decode an error-correcting code in examples of the present disclosure. Method 1200 may begin in block 1202 in FIG. 12.

In block 1202, decoder 110 sets the maximum decoder window size $W_D$. Block 1202 may be followed by block 1204.

In block 1204, decoder 110 starts to receive tuples over communication channel 108. Decoder 110 sets the decoder window boundary $L_D$ and decoding progress $M_D$ equal to the encoder window left boundary $L_E$ in the first tuple received, and the decoder window right boundary $R_D$ equal to the encoder window right boundary $R_E$ in the first tupe received. Block 1204 may be followed by block 1206.

In block 1206, decoder 110 starts to loop through the tuples in the order they are received. Block 1206 may be followed by block 1208.

In block 1208, decoder 110 determines if the encoded packet in the tuple is too old for a given decoder window (e.g., $L_E < L_D$). If so, block 1208 may be followed by block 1210. Otherwise block 1208 may be followed by block 1212.

In block 1210, decoder 110 drops the old encoded packet. Block 1210 may loop back to block 1206 to process the next tuple.

In block 1212, decoder 110 determines if the encoded packet is within the decoder window (e.g., $R_E > L_D + W_D$). If so, block 1212 may be followed by block 1214. Otherwise block 1212 may be followed by block 1216.

In block 1214, decoder 110 moves the decoder window left boundary L (e.g., set $L_D = R_E - W_D$) so the encoded packet falls within the decoded window. Block 1214 may be followed by block 1216.

In block 1216, decoder 110 determines if any encoded packets older than the current encoded packet have been lost (e.g., $M_D < L_D$). If so, block 1216 may be followed by block 1218. Otherwise block 1216 may be followed by block 1220.

In block 1218, decoder 110 notifies the user the loss of source packets $[M_D, L_D)$ and set decoding progress $M_D$ equal to decoding window left boundary $L_D$. Block 1218 may be followed by block 1220.

In block 1220, decoder 110 augments decoding matrix 1100 by generating pseudorandom coefficients c based on seed r received in the tuple and adding pseudorandom coefficients c and encoded packet b as a new row of decoding matrix 1110. Block 1220 may be followed by block 1222.

In block 1222, decoder 110 reduces decoding matrix 1110 to row echelon form. Block 1222 may be followed by block 1224 in FIG. 13.

In block 1224, decoder 110 determines if matrix A in decoding matrix 1110 can be further decoded up to a row $M_D'$. For example, decoder 110 determines if matrix A is decodable up to row $M_D'$ and then determines if matrix A has been decoded up to row $M_D'$ (e.g., $M_D' > M_D$). If matrix A can be further decoded up to row $M_D'$, block 1224 may be followed by block 1226. Otherwise block 1224 may loop back to block 1206 to process the next tuple.

In block 1226, decoder 110 decodes encoded packets in the range of [$M_D$, $M_D'$). As described above, decoder 110 may use backward substitution to decode the encoded packets. Block 1226 may be followed by block 1228.

In block 1228, decoder 110 determines if there are any source packets decoded from the encoded packets in block 1226 to be delivered to the user (e.g., $M_D < M_D'$). If so, block 1228 may be followed by block 1230. Otherwise block 1228 may loop back to block 1206 to process the next tuple.

In block 1230, decoder 110 retrieves a padded packet from the $M_D$th row of matrix B, extracts a source packet from the padded packet, and delivers the source packet to the user. Block 1230 may be followed by block 1232.

In block 1232, decoder 110 increments decoding progress $M_D$. Block 1232 may loop back to block 1228.

Demonstration of the Decoding Process

FIGS. 14, 15, 16, and 17 demonstrate method 1200 decoding tuples/coded packets in examples of the present disclosure. This is a continuation of the earlier demonstration where encoder 102 (FIG. 1) generated nine (9) coded packets as shown Table 2.

TABLE 2

| $L_E$ | $R_E$ | r | Data |
|---|---|---|---|
| 1 | 2 | 0 | 1 3 1 5 5 |
| 1 | 2 | 477 | 10 13 10 4 4 |
| 1 | 2 | 448 | 2 6 2 10 10 |
| 1 | 3 | 0 | 2 4 7 1 6 14 |
| 1 | 3 | 244 | 3 11 11 11 13 12 |
| 1 | 4 | 0 | 3 3 6 4 7 0 |
| 1 | 4 | 503 | 9 6 8 2 13 10 |
| 2 | 5 | 0 | 4 2 1 6 0 0 |
| 2 | 5 | 305 | 0 1 12 3 1 11 |

To demonstrate the capabilities of decoder 110 (FIG. 1), assume the first four (4) coded packets have been lost and encoded packets 5, 6, 7, and 8 have been received.

FIG. 14 shows the processing of the fifth coded packet in examples of the present disclosure. Initially decoder 110 sets decoder window left boundary $L_D$ to 1, decoding progress M to 1, and the decoder window size $W_D$ to 3. As there is only one row in the decoding matrix, decoder 110 does not reduce the decoding matrix to row echelon form and proceeds to process the next coded packet.

FIG. 15 shows the processing of the sixth coded packet in examples of the present disclosure. There are now two rows in the decoding matrix but decoder 110 does not reduce the decoding matrix to row echelon form as the decoding matrix is already in row echelon form.

FIG. 16 shows the processing of the seventh coded packet in examples of the present disclosure. There are now three rows in the decoding matrix. To reduce the decoding matrix to row echelon form, in step 1222, decoder 110 uses A(0,0) to clear A(2,0). In other words, decoder 110 uses elementary row operations to combine row 0 (which contains A(0,0)) and row 2 (which contains A(2,0)) in such a way as to leave A(2,0)=0. This is done by multiplying row 0 by the factor A(2,0)/A(0,0) and then subtracting it from row 2.

$$A(2,:) = A(2,:) - (A(2,0)/A(0,0))*A(0,:)$$

Note that the notation A(0,:) refers to row 0 of a two dimensional matrix A. Similarly, decoder 110 swaps A(1,:) and A(2,:) by using elementary row operations to interchange rows 1 and 2.

In step 1224, decoder 110 uses elementary row operations to convert the newly decodable rows from row echelon form to reduced row echelon form. Decoder 110 scales A(0,0) by multiplying A(0,0) by a factor 1/A(0,0) such that afterwards A(0,0) will be equal to 1. This is possible because every non-zero element in a field has a multiplicative inverse. Decoder 110 substitutes A(2,2) to clear A(1,2) by multiplying row 2 by the factor A(1,2)/A(2,2) and then subtracted row 2 from row 1. This will set A(1,2) to 0.

The process in step 1224 is called backwards substitution and is to be applied in a sequence from lower right in the matrix to upper left to minimize the amount of work.

When the coefficient section of the decoding matrix has a single 1, then the data part of the coefficient matrix is exactly the padded packet from encoder 102 corresponding to the position of the 1. Reduction to row echelon form ensures that each row of the decoding matrix contains no information about earlier source packets. After rows become decodable, the final backward substitution steps ensure that each row contains no information about later source packets. Thus at that point each decoded row has exactly one source packet that can be read off and delivered.

Figures 17, 18:
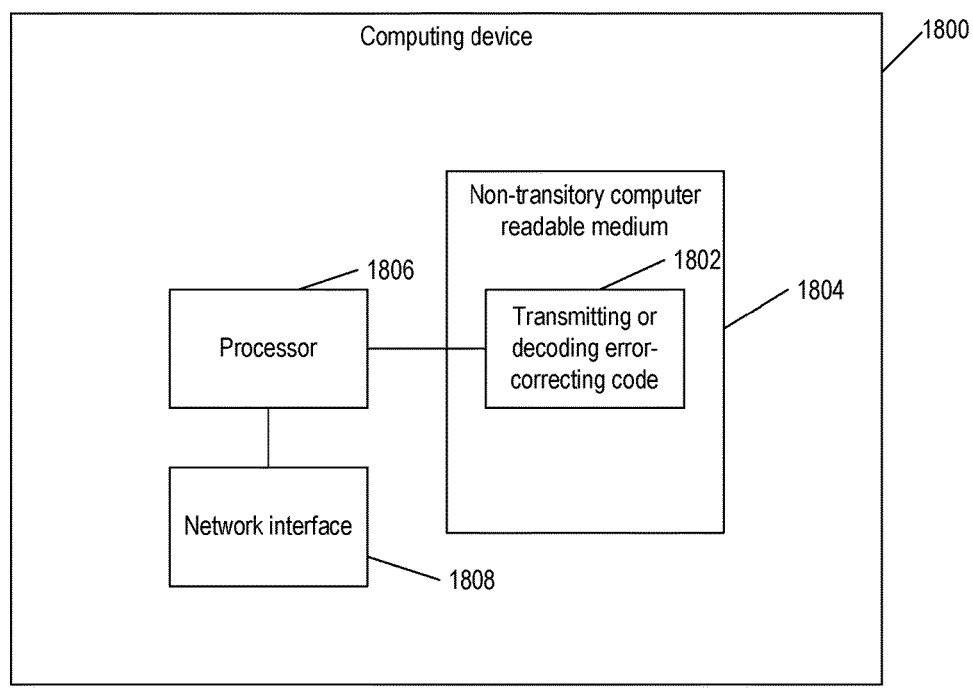

FIG. 17 shows the processing of the eighth coded packet in examples of the present disclosure. In steps 1212 to 1214, decoder 110 advances the decoder window by setting decoder window left boundary $L_D$ equal to 2 ($L_D = R_E - W_D = 5 - 3 = 2$). Note that decoder 110 may advance the decoder window to discard pseudorandom coefficients and delivered source packets outside of the decoder window in order to conserve memory.

Encoder 102 and decoder 110 (FIG. 1) may be implemented in software, hardware, or a combination of software and hardware. FIG. 18 is a block diagram of a computing device 1800 for implementing encoder 102 or decoder 110 in examples of the present disclosure. Code 1802 for transmitting and decoding error-correcting code is stored in a non-transitory computer readable medium 1804. A processor 1806 executes instructions 1802 to provide the described features and functionalities, and transmits or receives coded packets through a network interface 1808.

Commercial Applications

The present disclosure may improve the quality of videoconferencing over Wi-Fi or mobile phone networks. Wi-Fi networks have been measured and meaningful packet loss has been observed that could be solved by encoder 102, decoder 110, and the error-correcting code of the present disclosure.

The present disclosure may be applicable to situations where multiple communication paths exist, such as a mobile system with multiple cellular modems.

The present disclosure may be licensed to a mobile carrier (3G/4G etc.) to improve communication between handset and cell tower.

The present disclosure may be provided as a cloud service (using a proxy endpoint in the cloud) to individual customers to improve mobile communication and to provide a multipath solution.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A method to decode an error-correcting code, the method comprising:
   receiving a tuple including a seed and a coded packet over a communication channel;
   determining whether the tuple is older than a sliding decoding window, wherein any tuple older than the sliding decoding window is discarded, and when the tuple is newer than the sliding decoding window, advancing the sliding decoding window to include the tuple;
   based on the seed, reconstructing a set of pseudorandom coefficients used by an encoder to create the coded packet;
   entering the set of pseudorandom coefficients and the coded packet as a row in a decoding matrix, wherein the decoding matrix comprises a first matrix and a second matrix, the first matrix comprises sets pseudorandom coefficients including the set of pseudorandom coefficients, and the second matrix comprises coded packets including the coded packet;
   reducing the decoding matrix to a row echelon form;
   after reducing the decoding matrix to the row echelon form, determining if the decoding matrix is decodable up to a number of rows;
   when the decoding matrix is decodable up to the number of rows, reducing the decoding matrix up to the number of rows by backward substitution so a part of the first matrix becomes an identity matrix and a corresponding part of the second matrix comprise source packets; and
   extracting the source packets from padded packets.

2. The method of claim 1, further comprising:
   after extracting each source packet, incrementing a decoding progress variable;
   receiving another tuple;
   determining if the decoding progress variable is older than the sliding decoding window; and
   when the decoding progress variable is older than the sliding decoding window, generating an alert indicating that at least one source packet has been lost.

3. A computing device, comprising:
   a network interface;
   a processor configured to:
      receive a tuple including a seed and a coded packet through the network interface;
      determine whether the tuple is older than a sliding decoding window, wherein any tuple older than the sliding decoding window is discarded, and when the tuple is newer than the sliding decoding window, advance the sliding decoding window to include the tuple;
      based on the seed, reconstruct a set of pseudorandom coefficients used by an encoder to create the coded packet;
      enter the set of pseudorandom coefficients and the coded packet as a row in a decoding matrix, wherein the decoding matrix comprises a first matrix and a second matrix, the first matrix comprises sets pseudorandom coefficients including the set of pseudorandom coefficients, and the second matrix comprises coded packets including the coded packet;
      reduce the decoding matrix to a row echelon form;
      after reducing the decoding matrix to the row echelon form, determine if the decoding matrix is decodable up to a number of rows;
      when the decoding matrix is decodable up to the number of rows, reduce the decoding matrix up to the number of rows by backward substitution so a part of the first matrix becomes an identity matrix and a corresponding part of the second matrix comprises source packets; and
      extract the source packets from padded packets.

4. The computing device of claim 3, wherein the processor is further configured to:
   after extracting each source packet, increment a decoding progress variable;
   receive another tuple;
   determine if the decoding progress variable is older than the sliding decoding window; and
   when the decoding progress variable is older than the sliding decoding window, generate an alert indicating that at least one source packet has been lost.

5. A non-transitory machine readable medium embodying instructions, which in response to execution by a processor, causes the processor to perform a method of decoding an error-correcting code, the method comprising:
   receiving a tuple including a seed and a coded packet over a communication channel;
   determining whether the tuple is older than a sliding decoding window, wherein any tuple older than the sliding decoding window is discarded, when the tuple is newer than the sliding decoding window, advancing the sliding decoding window to include the tuple;
   based on the seed, reconstructing a set of pseudorandom coefficients used by an encoder to create the coded packet;
   entering the set of pseudorandom coefficients and the coded packet as a row in a decoding matrix, wherein the decoding matrix comprises a first matrix and a second matrix, the first matrix comprises sets pseudorandom coefficients including the set of pseudorandom coefficients, and the second matrix comprises coded packets including the coded packet;
   reducing the decoding matrix to a row echelon form;
   after reducing the decoding matrix to the row echelon form, determining if the decoding matrix is decodable up to a number of rows;
   when the decoding matrix is decodable up to the number of rows, reducing the decoding matrix up to the number of rows by backward substitution so a part of the first matrix becomes an identity matrix and a corresponding part of the second matrix comprise source packets; and
   extracting the source packets from padded packets.

6. The non-transitory machine readable medium of claim 5, wherein the method further comprising:
   after extracting each source packet, incrementing a decoding progress variable;
   receiving another tuple;
   determining if the decoding progress variable is older than the sliding decoding window; and
   when the decoding progress variable is older than the sliding decoding window, generating an alert indicating that at least one source packet has been lost.

* * * * *